(12) United States Patent
Choi

(10) Patent No.: US 7,939,358 B2
(45) Date of Patent: May 10, 2011

(54) SEMICONDUCTOR SUBSTRATE, METHOD OF FABRICATING THE SAME, METHOD OF FABRICATING SEMICONDUCTOR DEVICE, AND METHOD OF FABRICATING IMAGE SENSOR

(75) Inventor: Joon-Young Choi, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 354 days.

(21) Appl. No.: 12/132,132

(22) Filed: Jun. 3, 2008

(65) Prior Publication Data

US 2009/0174037 A1 Jul. 9, 2009

(30) Foreign Application Priority Data

Jun. 11, 2007 (KR) .................. 10-2007-0056877

(51) Int. Cl.
*H01L 21/00* (2006.01)
(52) U.S. Cl. ....... 438/57; 438/70; 438/144; 257/E27.13; 257/E27.15
(58) Field of Classification Search ............... 438/70, 438/144, 145, 478, 57; 257/E27.13–E27.134, 257/E27.15, E21.461
See application file for complete search history.

(56) References Cited

U.S. PATENT DOCUMENTS

| 2006/0006488 A1* | 1/2006 | Kanbe ......................... 257/443 |
| 2006/0063352 A1* | 3/2006 | Barlocchi et al. ............. 438/455 |
| 2006/0252187 A1* | 11/2006 | Ramaswamy et al. ........ 438/151 |
| 2007/0184571 A1* | 8/2007 | Yang .............................. 438/48 |
| 2008/0014726 A1* | 1/2008 | Cha et al. ...................... 438/487 |

FOREIGN PATENT DOCUMENTS

| EP | 1638141 A1 | 3/2006 |
| JP | 2005-142221 | 6/2005 |
| JP | 2006-019360 | 1/2006 |
| JP | 2006-128392 | 5/2006 |
| KR | 2004-0015282 | 2/2004 |
| KR | 2006-0048661 | 5/2006 |
| KR | 2006-0077117 | 7/2006 |

OTHER PUBLICATIONS

English language abstract of Japanese Publication No. 2005-142221.
English language abstract of Japanese Publication No. 2006-019360.
English language abstract of Japanese Publication No. 2006-128392.

* cited by examiner

*Primary Examiner* — Michael S Lebentritt
*Assistant Examiner* — Daniel Whalen
(74) *Attorney, Agent, or Firm* — F. Chau & Associates, LLC

(57) ABSTRACT

In an example embodiment, an image sensor includes a semiconductor layer and isolation regions disposed in the semiconductor layer. The isolation regions define active regions of the semiconductor layer. The image sensor further includes photoelectric converters disposed in the semiconductor layer and at least one wiring layer disposed over a top surface of the semiconductor layer. The image sensor also includes color filters disposed below a bottom surface of the semiconductor layer and lenses disposed below the color filters. Each lens is arranged to concentrate incoming light into an area spanned by a corresponding photoelectric converter.

14 Claims, 9 Drawing Sheets

SEMICONDUCTOR SUBSTRATE, METHOD OF FABRICATING THE SAME, METHOD OF FABRICATING SEMICONDUCTOR DEVICE, AND METHOD OF FABRICATING IMAGE SENSOR

CROSS-REFERENCE TO RELATED APPLICATIONS

This application claims priority from Korean Patent Application No. 10-2007-0056877 filed on Jun. 11, 2007 in the Korean Intellectual Property Office, the disclosure of which is incorporated herein by reference in its entirety.

BACKGROUND

1. Technical Field

This disclosure relates to semiconductor substrates, semiconductor devices, and image sensors, as well as methods of fabricating semiconductor substrates, semiconductor devices, and image sensors.

2. Description of the Related Art

Image sensors are devices that convert optical images into electrical signals. Recently, with the development of the computer and communication industries, the demand for image sensors with enhanced performance is growing, as they are now used in digital cameras, camcorders, personal communication systems (PCS), game devices, surveillance cameras, micro-cameras for medical use, and robots.

In an image sensor, light output from a lens formed on a multi-wiring layer passes between wiring layers of the multi-wiring layer, and is then input to a photoelectric converter. In this structure, the multi-wiring layer attenuates the light. Therefore, the amount of light actually reaching the photoelectric converter may be insufficient. That is, since the multi-wiring layer reduces the aperture ratio of the photoelectric converter, the amount of light incident on the photoelectric converter significantly decreases, which, in turn, reduces sensitivity.

In order to solve this problem, a rear-side irradiation-type image sensor has been implemented. In the rear-side irradiation-type image sensor, light is irradiated from the rear side of a semiconductor substrate (opposite the multi-wiring layer), and a photoelectric converter receives the light. In this structure, the multi-wiring layer does not hinder the light. In addition, the effective aperture ratio of the photoelectric converter can be increased, and sensitivity can be enhanced.

In order to form the rear-side irradiation-type image sensor, the lower part of the semiconductor substrate must be removed after the photoelectric converter and the multi-wiring layer are formed on the semiconductor substrate. Here, the lower part of the semiconductor substrate must be uniformly removed close to the photoelectric converter without damaging the photoelectric converter, so that the photoelectric converter can receive uniform light. Therefore, a technology for uniformly removing the whole surface of the semiconductor substrate without damaging the photoelectric converter is needed.

SUMMARY

In one embodiment, a semiconductor substrate includes a lower region of a substrate; a trench region of the substrate; and a semiconductor layer disposed on the trench region of the substrate. The trench region is disposed on the lower region and includes a plurality of trenches.

In another embodiment, the trenches have substantially equal depths.

In yet another embodiment, the semiconductor substrate further comprises a buried film that fills the trenches. The buried film may comprise an oxide film. The semiconductor layer may comprise an epitaxial layer. The semiconductor layer may be selected from the group consisting of a silicon layer and a silicon-germanium layer.

According to some embodiments, a method of fabricating a semiconductor substrate includes providing a substrate, forming a plurality of trenches in an upper part of the substrate, and forming a semiconductor layer on a surface of the substrate.

BRIEF DESCRIPTION OF THE DRAWINGS

The above and other features and advantages of the invention will become apparent by describing example embodiments with reference to the attached drawings, in which.

DETAILED DESCRIPTION OF THE EXAMPLE EMBODIMENTS

Figure 1:
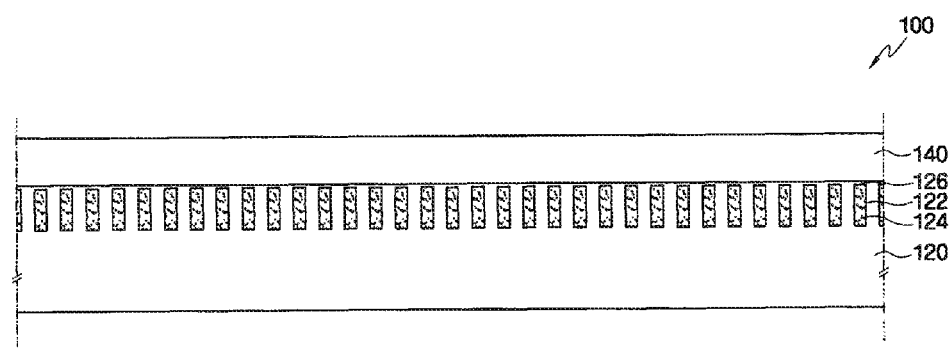
FIG. 1 is a cross-sectional view of a semiconductor substrate according to an example embodiment.

Example embodiments will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the inventive principle or principles found in the example embodiments to those skilled in the art. In some embodiments, well-known device structures and well-known technologies will not be specifically described in order to avoid ambiguity. Furthermore, those of skill in the art will recognize that a n-type substrate is often doped with p-type dopants, or vice versa. Thus, each embodiment described and illustrated herein contemplates either situation.

Like reference numerals denote like elements throughout this specification, and thus common elements that are found in more than one example embodiment may be described only once in the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Hereinafter, a semiconductor substrate according to example embodiments will be described in detail. FIG. 1 is a cross-sectional view of a semiconductor substrate 100 according to an example embodiment.

Referring to FIG. 1, the semiconductor substrate 100 includes a substrate 120 and a semiconductor layer 140. The substrate 120 may be, but is not limited to, a silicon substrate, a gallium arsenide substrate, a silicon germanium substrate, a ceramic substrate, or a quartz substrate.

Trenches 122 are formed in an upper part of the substrate 120. That is, the substrate 120 is divided into a trench region in which the trenches 122 are formed and a lower region in which the trenches 122 are not formed.

The trenches 122 may be formed across a whole surface of the substrate 120, or across a partial surface of the substrate. The trenches 122 may have substantially uniform diameters and substantially uniform depths, but in other embodiments the diameters and depths of the trenches may not be uniform. Preferably, the trenches 122 have substantially equal depths of, for example, approximately 0.1 to 100 µm. The trenches 122 may be shaped as rows of holes, or as lines. Preferably, a width of each hole or line may be, for example, approximately 0.1 to 100 µm, but other example embodiments are not so limited.

In addition, the trenches 122 may be filled by a buried film 124. The buried film 124 may be an oxide film, a nitride film, or an oxy-nitride film. However, other example embodiments are not so limited. That is, any film can be used as the buried film 124 as long as it is formed of a material different from the material of the substrate 120. A seed layer 126 may be formed on a top surface of the buried film 124. The seed layer 126 on the top surface of the buried film 124 may be formed of a material identical to that of the substrate 120.

The semiconductor layer 140 is formed on the substrate 120. The semiconductor layer 140 may be an epitaxial layer such as a silicon layer or a silicon-germanium layer. The semiconductor layer 140 preferably has a substantially flat top surface.

The semiconductor substrate 100 includes the trench region in which the trenches 122 are formed and which is located at a position connecting the substrate 120 to the semiconductor layer 140. The trench region refers to a region in which the buried film 124 filling the trenches 122 is formed on the whole surface of the substrate 120. The trench region effectively distinguishes the lower region of the substrate 120 from the semiconductor layer 140. Since the substrate 120 and the semiconductor layer 140 are easily distinguished, the lower region of the semiconductor substrate 100 can be readily removed, when necessary, during a semiconductor fabrication process. In addition, the semiconductor substrate 100 can be fabricated at a lower cost than other substrates, such as a silicon-on-insulator (SOI) substrate. Therefore, fabrication costs are reduced, which may enhance profitability.

Hereinafter, a method of fabricating a semiconductor substrate according to example embodiments is described with reference to FIGS. 1 through 5. FIGS. 2 through 5 are cross-sectional views for explaining the method of fabricating a semiconductor substrate according to the example embodiments.

When the fabrication method is described below, processes which can be performed according to processing operations well known to those of ordinary skill in the art will be omitted or very briefly described for the sake of brevity.

Figure 2:
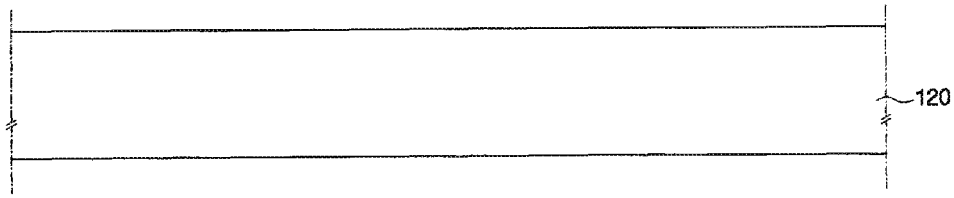
FIGS. 2 through 5 are cross-sectional views for explaining a method of fabricating a semiconductor substrate according to example embodiments.

Referring to FIG. 2, a substrate 120 is provided. The substrate 120 may be, for example, a silicon substrate, a gallium arsenide substrate, a silicon germanium substrate, a ceramic substrate, or a quartz substrate, but other example embodiments are not so limited.

Figure 3:
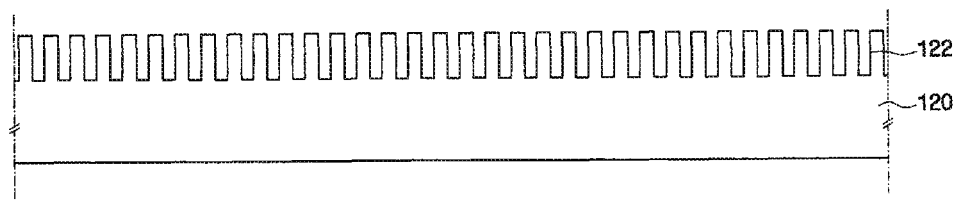

Referring to FIG. 3, a plurality of trenches 122 are formed in an upper part of the substrate 120.

Specifically, a mask layer, such as photoresist, is formed on the substrate 120, and a photolithography process is performed on the mask layer to form a mask pattern. Then, the substrate 120 is etched using the mask pattern as an etching mask. As a result, the trenches 122 are formed in the upper part of the substrate 120. Here, the trenches 122 may be formed by dry etching or wet etching.

The trenches 122 may be formed on a whole surface of the substrate 120. The trenches 122 may have uniform diameters. The trenches 122 may also have substantially equal depths of, for example, approximately 0.1 to 100 µm. The trenches 122 may be holes or lines. In this case, a width of each hole or line may be, for example, approximately 0.1 to 100 µm. The width of each hole or line, that is, each of the trenches 122, may be such that an upper part of each of the trenches 122 can be blocked by a subsequent heat-treatment process.

Figure 4:
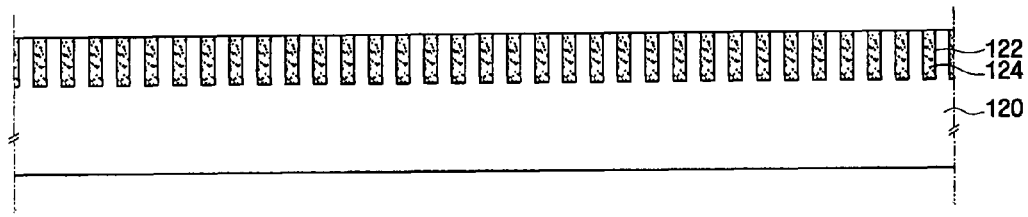

Referring to FIG. 4, the trenches 122 are filled by the buried film 124. Specifically, a filled material is deposited on the substrate 120 by, for example, chemical vapor deposition (CVD). Then, a chemical mechanical polishing (CMP) process is performed to planarize a top surface of the substrate 120. The buried film 124 may be, for example, an oxide film, a nitride film, or an oxy-nitride film.

Figure 5:
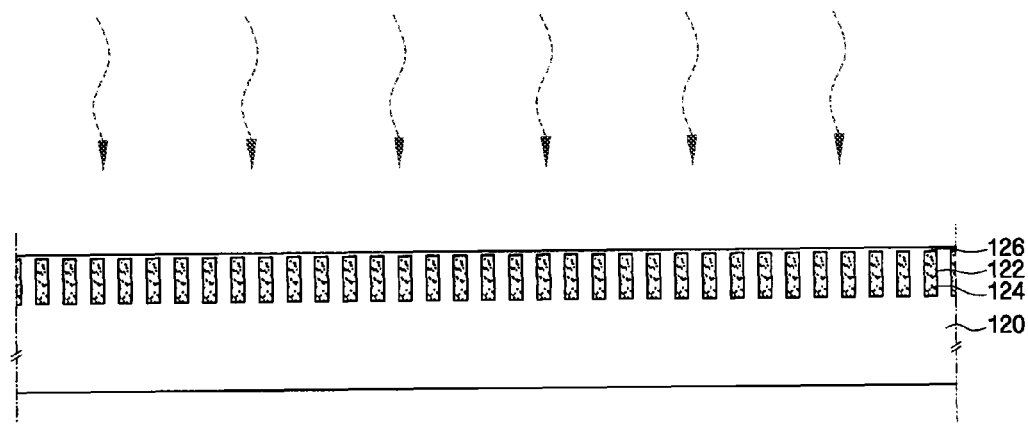

Referring to FIG. 5, the substrate 120 is supplied with hydrogen and heat-treated. When the substrate 120 is supplied with hydrogen and heat-treated, part of the silicon around the trenches 122 migrates onto the buried film 124, thereby covering an upper part of the buried film 124. Preferably, since the width of each of the trenches 122 is as narrow as approximately 0.1-100 µm, if part of the silicon migrates onto the buried film 124 by heat treatment, a top surface of the buried film 124 is covered by the silicon. Consequently, a seed layer 126 may be formed on the top surface of the buried film 124.

Referring back to FIG. 1, a semiconductor layer 140 is formed on a substantial portion of the surface of the substrate 120. The semiconductor layer 140 may be formed by, for example, a selective epitaxial growing (SEG) process. Here, silicon may be grown on an exposed top surface of the substrate 120 and the seed layer 126 formed on the buried film 124. That is, since silicon is uniformly formed on the top surface of the substrate 120, the semiconductor layer 140 may be formed in a uniform manner.

The SEG process may include, for example, a CVD process, a reduced pressure chemical vapor deposition (RPCVD) process, or an ultra-high vacuum chemical vapor deposition (UHVCVD) process. Other example embodiments are not so limited. A source gas, such as $SiH_4$, dichlorosilane ($SiH_2Cl_2$; DCS) or trichlorosilane ($SiHCl_3$; TCS), may be used to perform the SEG process. In addition, the SEG process and the doping of impurities may be simultaneously performed through in-situ. Alternatively, the doping of the impurities may be performed after the SEG process.

Figure 6:
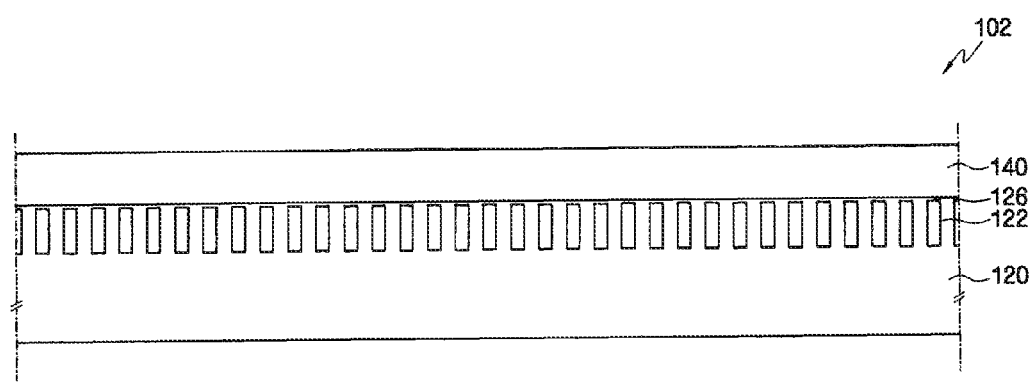
FIG. 6 is a cross-sectional view of a semiconductor substrate according to another example embodiment.

Hereinafter, a semiconductor substrate according to another example embodiment is described. FIG. 6 is a cross-sectional view of a semiconductor substrate 102 according to another example embodiment. Elements substantially identical to those of the previous embodiment illustrated in FIG. 1 are indicated by like reference numerals, and thus their description will be omitted.

The semiconductor substrate 102 differs from the semiconductor substrate 100 in that the trenches 122 of semiconductor substrate 100 are not filled by a buried film. In other words, the trenches 122 of the semiconductor substrate 100 are empty. In the semiconductor substrate 102, the trenches 122 are formed in a top surface of a substrate 120, and a seed layer 126 that is subsequently formed on the trenches 122 blocks the trenches 122. Then, a semiconductor layer 140 is formed on the substrate 120.

Hereinafter, a method of fabricating a semiconductor substrate according to another example embodiment is described with reference to FIGS. 2, 3, 5, and 6. The processes illustrated by FIGS. 2 and 3 are shared by both example embodiments, so will not be described again. In contrast to the example embodiment described above, immediately after the trenches 122 are formed in FIG. 2, the heat-treatment process is performed, as shown in FIG. 5. It should be remembered, however, that unlike the embodiment described above, in this embodiment there is no buried film 124 that fills the trenches 122.

During the heat-treatment process, silicon around the empty trenches 122 migrates over the openings of the trenches 122, thereby blocking the trench openings and forming a seed layer 126. This results in empty space within the trenches 122. Meanwhile, since the top surface of the trenches 122 are blocked by the seed layer 126, a semiconductor layer 140 can be uniformly formed over the trenches 122.

Hereinafter, an image sensor according to an example embodiment will be described in detail with reference to the attached drawings. The image sensor according to example embodiments may include a charge coupled device (CCD) image sensor or a complementary metal oxide semiconductor (CMOS) image sensor.

A CCD image sensor produces less noise and better image quality than the CMOS image sensor, but requires a higher operating voltage and is more costly to fabricate. A CMOS image sensor can be easily operated and implemented using various scanning methods. In addition, since signal processing circuits can be integrated on a single chip, smaller products can be produced. Also, CMOS processing technology can be used and thus reduce the fabrication cost. Due to its very low power consumption, the CMOS image sensor can be easily applied to products with limited battery capacity. The description of the example embodiment that follows assumes that the image sensor is a CMOS image sensor, but it should be recognized that the inventive principles may also be applied when the image sensor is a CCD.

Figure 7:
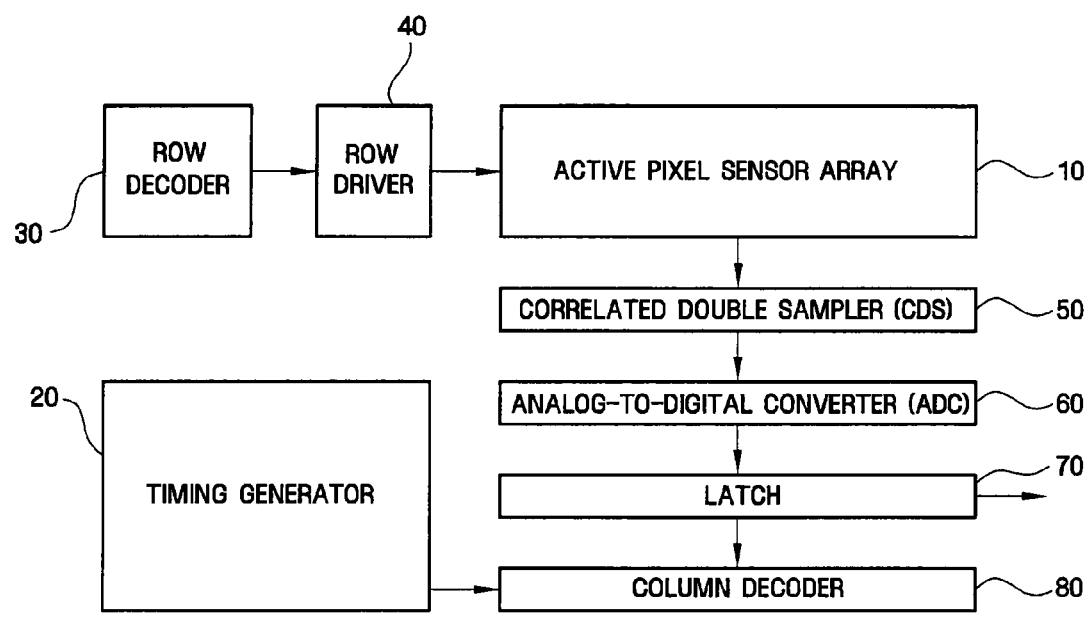
FIG. 7 is a block diagram of an image sensor according to example embodiments.

FIG. 7 is a block diagram of an image sensor 700 according to example embodiments. Referring to FIG. 7, the image sensor includes an Active Pixel Sensor (APS) array 10, a timing generator 20, a row decoder 30, a row driver 40, a correlated double sampler (CDS) 50, an analog-to-digital converter (ADC) 60, a latch 70, and a column decoder 80.

The APS array 10 includes several unit pixels arranged in two dimensions. The unit pixels convert an optical image into an electrical signal. The APS array 10 operates in response to driving signals received from the row driver 40, such as a pixel selection signal ROW, a reset signal RST and a charge transmission signal TG. In addition, the APS array 10 provides the electrical signal to the CDS 50 via a vertical signal line.

The timing generator 20 provides a timing signal and a control signal to the row decoder 30 and the column decider 80. The row driver 40 provides the driving signals to the APS array 10 to drive the unit pixels according to the decoding result of the row decoder 30. When the unit pixels are arranged in a matrix form, a driving signal is provided for each row of unit pixels.

The CDS 50 receives the electrical signal from the APS array 10 via the vertical signal line and holds and samples the received electrical signal. That is, the CDS 50 double-samples a reference voltage level (hereinafter, referred to as a "noise level") and a voltage level (hereinafter, referred to as a "signal level") of the electrical signal and outputs a differential level corresponding to the difference between the noise level and the signal level.

The ADC 60 converts an analog signal, which corresponds to the difference level, into a digital signal and outputs the digital signal. The latch 70 latches the digital signal, and the latched signal is sequentially output to an image signal processor (not shown) according to the decoding result of the column decoder 80.

Figure 8:
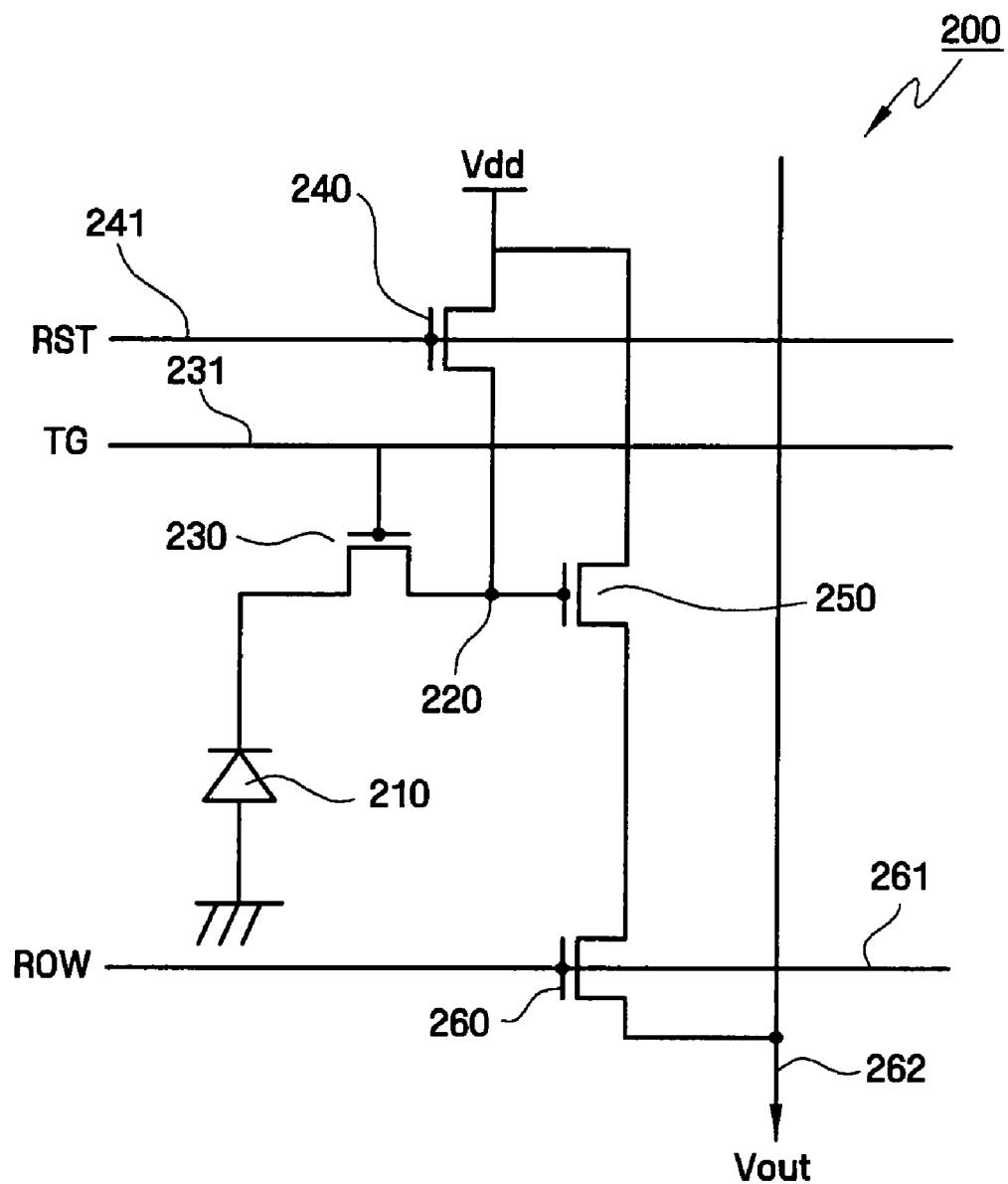
FIG. 8 is a circuit diagram of a unit pixel of an image sensor according to example embodiments.

FIG. 8 is a circuit diagram of a unit pixel 200 of an image sensor according to example embodiments. Referring to FIG. 8, the unit pixel 200 of the image sensor includes a photoelectric converter 210, a charge detector 220, a charge transmitter 230, a resetter 240, an amplifier 250, and a selector 260. In the present embodiment, the unit pixel 200 has a four-transistor structure as illustrated in FIG. 8. However, the unit pixel 200 may have a five-transistor structure.

The photoelectric converter 210 absorbs incident light and accumulates electric charges corresponding to the amount of the incident light. The photoelectric converter 210 may include a photodiode, a phototransistor, a photogate, a pinned photodiode (PPD), or a combination of these devices.

The charge detector 220 is implemented as a floating diffusion (FD) region, and receives the electric charge accumulated by the photoelectric converter 210. Since the charge detector 220 has a parasitic capacitance, it can cumulatively store the electric charge. The charge detector 220 is electrically connected to a gate of the amplifier 250, and thus controls the amplifier 250.

The charge transmitter 230 transmits the electric charges from the photoelectric converter 210 to the charge detector 220. As shown, the charge transmitter 230 includes a transistor that is controlled by the charge transmission signal TG.

The resetter 240 periodically resets the charge detector 220. A source of the resetter 240 is connected to the charge detector 220, and a drain thereof is connected to a power supply voltage Vdd. In addition, the resetter 240 operates in response to the reset signal RST.

The amplifier 250 is combined with a constant current source (not shown), which is positioned outside the unit pixel 200, and functions as a source-follower buffer amplifier. A voltage, which varies according to a voltage of the charge detector 220, is output from the amplifier 250 to a vertical signal line 162. A source of the amplifier is connected to a drain of the selector 260, and a drain thereof is connected to the power supply voltage Vdd.

The selector 260 selects the unit pixel 200 to be read by row. The selector 260 operates in response to the row selection signal ROW, and a source of the selector 260 is connected to the vertical signal line 162.

Driving signal lines 231, 241, and 261 of the charge transmitter 230, the resetter 240 and the selector 260, respectively, extend in a row direction (a horizontal direction) so that unit pixels in the same row can operate simultaneously.

Hereinafter, a method of fabricating an image sensor according to example embodiments is described with reference to FIGS. 9 through 15. FIG. 10A is a schematic plan view of an APS array of the image sensor. FIG. 10B is a cross-sectional view of the APS array taken along a line IV-IV' of FIG. 10A.

Figure 9:
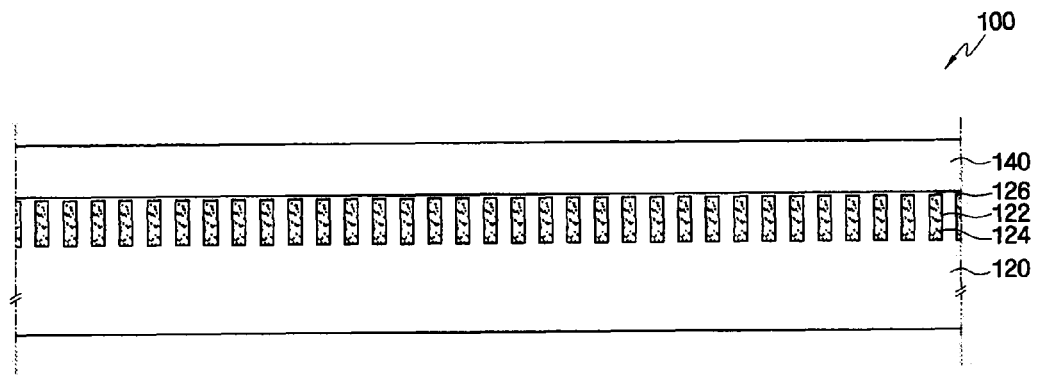
FIGS. 9 through 15 are diagrams for explaining a method of fabricating an image sensor according to example embodiments.
Figure 10A:
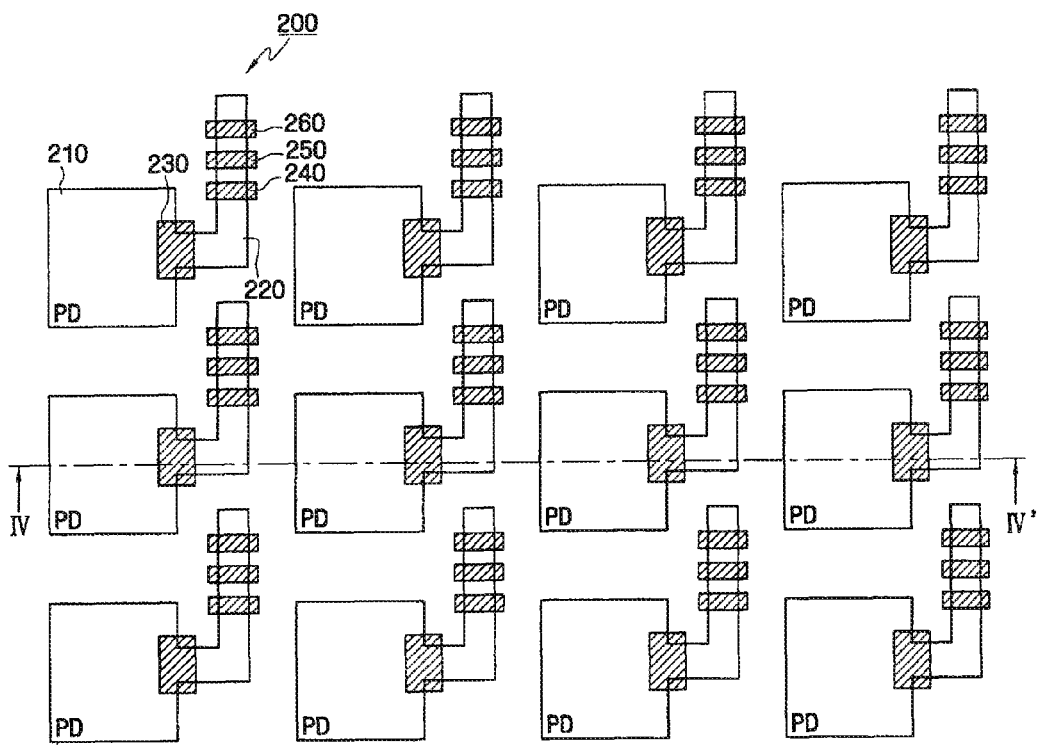
Figure 10B:
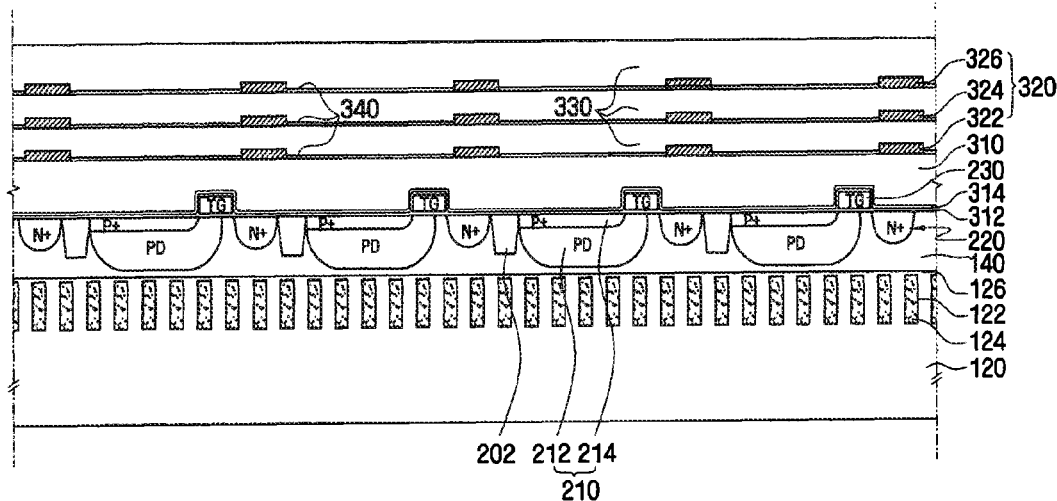

Referring to FIG. 9, a semiconductor substrate 100 including a substrate 120 and a semiconductor layer 140 is provided. Trenches 122 are formed in an upper part of the substrate 120 and are filled by a buried film 124. In addition, the semiconductor layer 140 is uniformly formed on a top surface of the substrate 120 having the trenches 122.

Referring to FIGS. 10A and 10B, photoelectric converters 210 and a wiring layer that includes a number of metal wirings 320 and a plurality of inter-metal insulating films 330 are formed on the semiconductor layer 140.

First, isolation regions 202 are formed on the semiconductor layer 140, thereby defining active regions (not shown). The isolation regions 202 may be field oxide (FOX) formed using a local oxidation of silicon (LOCOS) technique or a shallow trench isolation (STI) technique.

Then, impurities are ion-implanted onto the active regions (not shown) to form the photoelectric converters 210, each including a photodiode 212 and a pinning layer 214. In addition, transistors corresponding to charge detectors 220, charge transmitters 230, resetters 240, amplifiers 250 and selectors 260 are formed.

Next, an inter-layer insulating film 310 is formed to cover the surface of the semiconductor layer 140, and to fill the empty space where transistors are not formed. Before the inter-layer insulating film 310 is formed, insulating films 312 and 314 may be formed on the photoelectric converters 210. Each of the insulating films 312 and 314 may consist of an oxide film or a nitride film. Alternatively, each of the insulating films 312 and 314 may include oxide films, nitride films, or a combination of oxide and nitride films. The oxide film or the nitride film may be a silicide blocking film or an etch-stop film.

Then, the wiring layer including the inter-metal insulating films 330 and the metal wirings 320 is formed on the inter-layer insulating film 310. Etch-stop films 340 may be formed between the inter-metal insulating films 330. If the metal wirings 320 are stacked in two or three layers, the inter-metal insulating films 330, which are inter-layer insulating materials, are filled between an upper metal wiring and a lower metal wiring of the metal wirings 320. In addition, the upper metal wiring and the lower metal wiring are connected to each other by a via hole (not shown). In FIG. 10B, three metal wirings 322, 324, and 326 are illustrated.

The metal wirings 320 may be formed of tungsten (W) or copper (Cu). The inter-metal insulating films 330 may be formed of flowable oxide (FOX), high density plasma (HDP), tonen silazene (TOSZ), spin on glass (SOG), or undoped silica glass (USG). The etch-stop films 340 may be formed between the inter-metal insulating films 330 and may be formed of SiN.

Figure 11:
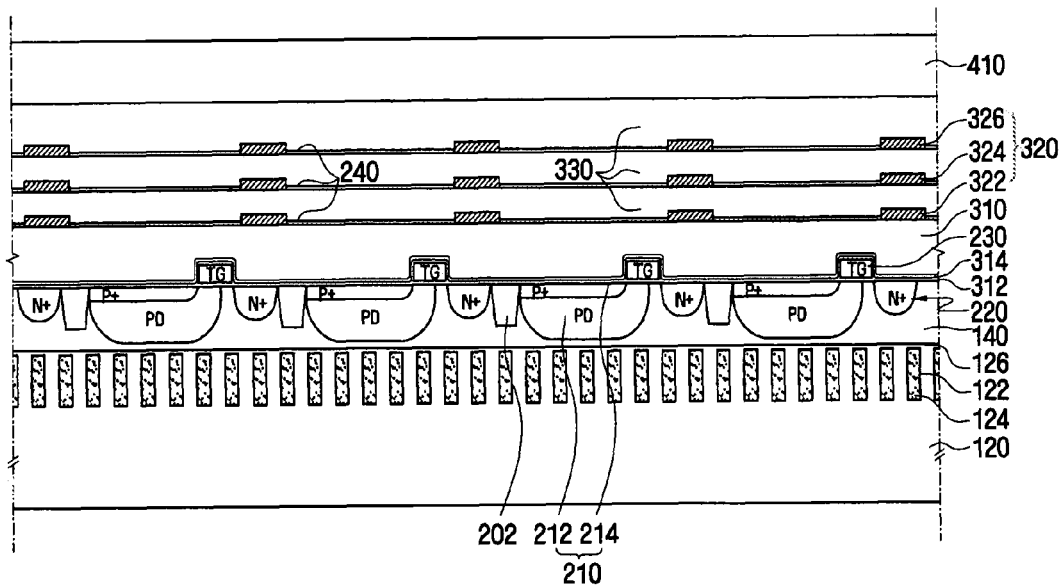

Referring to FIG. 11, a supporting substrate 410 is bonded onto the wiring layer. The supporting substrate 410 supports the wiring layer and the semiconductor layer 140 in a subsequent process. The supporting substrate 410 may be formed of a semiconductor substrate such as the substrate 120.

Figure 12:
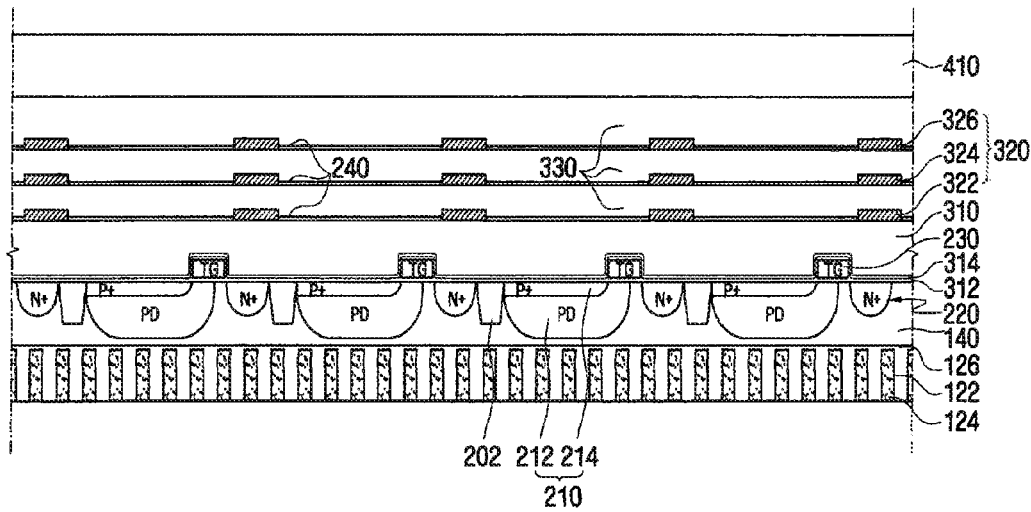

Referring to FIG. 12, a lower region of the substrate 120 is removed to expose an end of each of the trenches 122. The lower region of the substrate 120 may be removed by, for example, the CMP process. The CMP is performed until an end of each of the trenches 122 is exposed. In this case, the buried film 124 filling the inside of each of the trenches 122 may be used as an etch-stop film.

Figure 13:
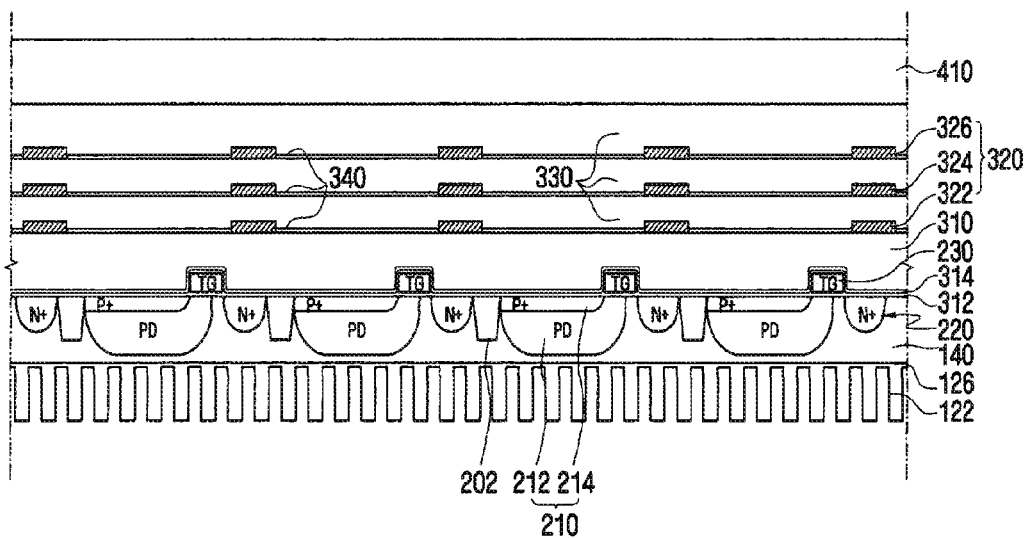

Referring to FIG. 13, the buried film 124 filling the trenches 122 is removed. The buried film 124 may be removed by wet etching. Using an etching solution having a high etch selectivity to the buried film 124 on the substrate 120 allows only the buried film 124 to be selectively removed.

Figure 14:
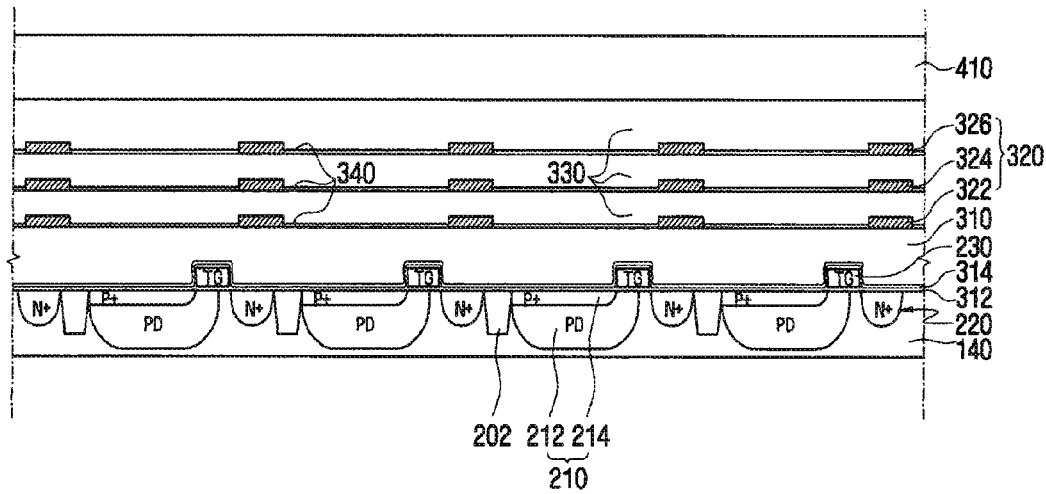

Referring to FIG. 14, the semiconductor layer 140 is exposed by removing a trench region which is an upper region of the substrate 120 and in which the trenches 122 are formed. Since the lower region of the substrate 120 has been removed in a previous process, only the trench region, in which the trenches 122 are formed, remains. The trench region has a significantly wide cross section because it is empty inside. Therefore, if the trench region having the wide cross section is etched using an appropriate etching solution, it can be etched far faster than the semiconductor layer 140 can be. Consequently, only the trench region of the remaining substrate 120 may be selectively removed. Then, a bottom surface of the semiconductor layer 140 may be planarized by the CMP process.

Figure 15:
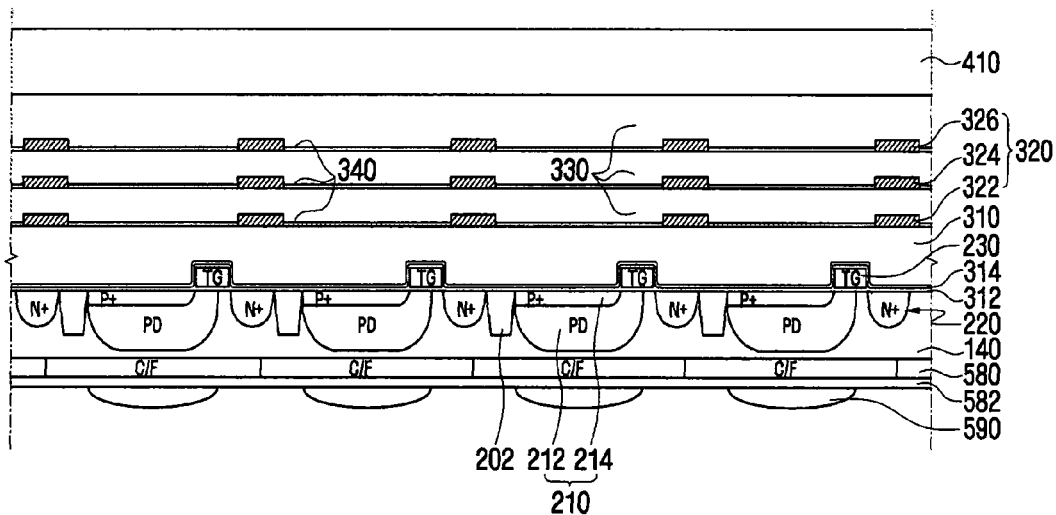

Referring to FIG. 15, color filters 580 and micro-lenses 590 are formed on the bottom surface of the semiconductor layer 140.

The color filters 580 may include red, green and blue filters arranged in a Bayer pattern. In the Bayer pattern, half of the color filters 580 are the green filters, which require accuracy since the human eye is most sensitive to the green wavelengths. However, the arrangement of the color filters 580 may vary.

The micro-lenses 590 are formed at locations corresponding to the photoelectric converters 210 under the color filters 580. The micro-lenses 590 change the path of light incident on regions other than the region of the photoelectric converters 210, and concentrate the light on the region of the photoelectric converter 210.

A planarization layer 580 may be formed between the color filters 580 and the micro-lenses 590 and may be formed of, for example, thermosetting resin. In this example method of fabricating the image sensor, when the substrate 120 is removed, only the trench region, in which the trenches 122 are formed, can be removed. That is, the substrate 120 can be selectively removed more easily. In addition, since the unremoved semiconductor layer 140 can have a more uniform thickness, a uniform amount of light can be incident to the image sensor, which, in turn, may enhance the characteristics of the image sensor. That is, the substrate 120 can be removed more efficiently and effectively, thereby improving the manufacturing process and the image sensor.

Figure 16:
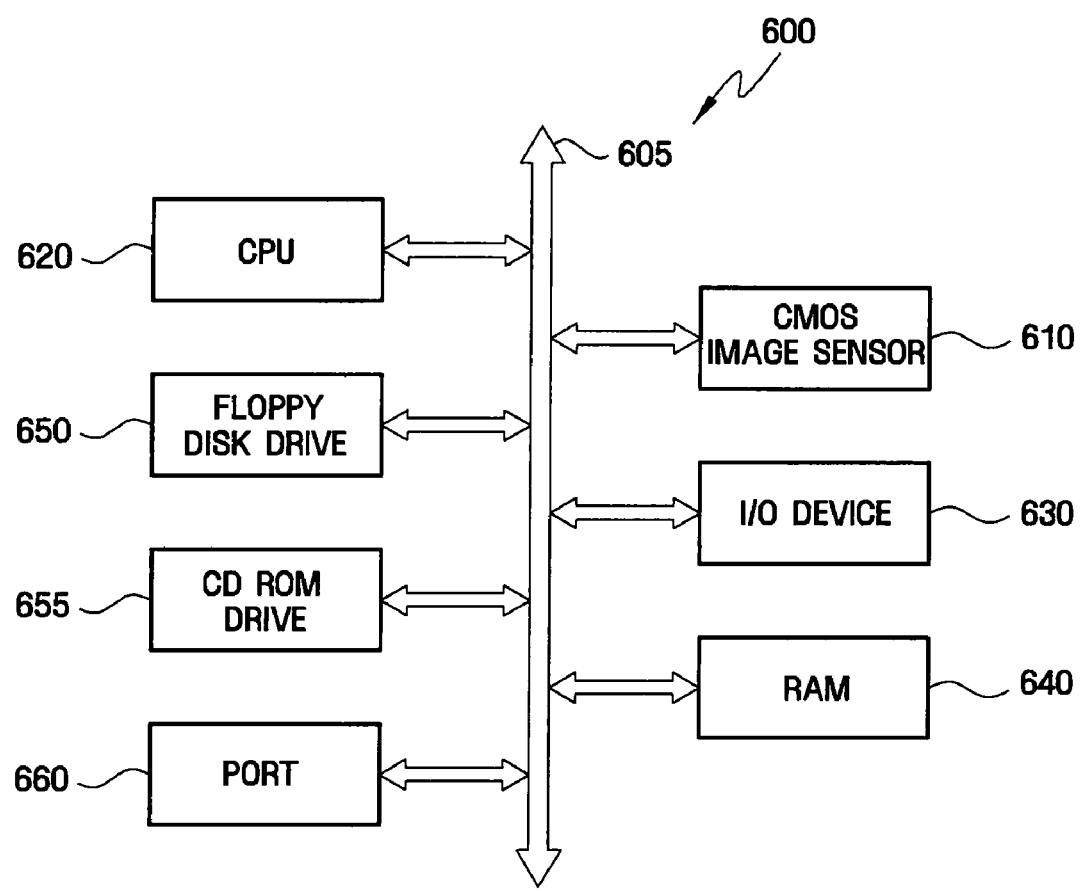
FIG. 16 is a schematic diagram illustrating a processor-based system including an image sensor according to example embodiments.

FIG. 16 is a schematic diagram illustrating a processor-based system 600 including an image sensor according to example embodiments. Referring to FIG. 16, the processor-based system 600 processes an output image of a CMOS image sensor 610. The processor-based system 600 may be, for example, a computer system, a camera system, a scanner, a mechanized clock system, a navigation system, a video phone, a surveillance system, an automatic focus system, a tracking system, a motion monitoring system, or an image stabilization system. However, other example embodiments are not so limited.

The processor-based system 600, such as a computer system, includes a central processing unit (CPU) 620, such as a microprocessor, which can communicate with an input/output (I/O) device 630 through a bus 605. The CMOS image sensor 610 can communicate with the processor-based system 600 through the bus 605 or another communication link. The processor-based system 600 may further include a random access memory (RAM) 640, a floppy disk drive 650 and/or a compact disc read-only memory (CD ROM) drive 655, and a port 660 which can communicate with the CPU 620 through the bus 605. The port 660 may be coupled to a video card, a sound card, a memory card or a universal serial bus (USB) device, or may communicate with another system. The CMOS image sensor 610 can be integrated with a CPU, a digital signal processor (DSP), or a microprocessor. Alternatively, the CMOS image sensor 610 may be integrated with a memory. When necessary, the CMOS image sensor 610 may be integrated on a different chip than the processor.

While a method of fabricating an image sensor using a semiconductor substrate according to an example embodiments has been described above, it will be understood by those of ordinary skill in the art that the inventive principles can be applied to all processes of removing a lower region of the semiconductor substrate, which, therefore, will not be described.

As described above, a method of fabricating an image sensor according to example embodiments provides at least one of the following advantages. First, since a substrate can be selectively removed more easily, an unremoved semiconductor layer can have a more uniform thickness. Accordingly, a uniform amount of light can be incident on the image sensor, thereby enhancing the characteristics of the image sensor. Second, the productivity of the image sensor can be improved by removing the substrate more efficiently and effectively.

The invention may be practiced in many ways. What follows are example, non-limiting descriptions of various example embodiments.

Some embodiments provide a semiconductor substrate with enhanced productivity. Some embodiments provide a method of fabricating a semiconductor substrate with enhanced productivity. Some embodiments provide a method of fabricating a semiconductor device with enhanced productivity. Some embodiments provide a method of fabricating an image sensor with enhanced productivity.

According to some embodiments, a semiconductor substrate includes a substrate and a semiconductor layer formed on the substrate. The substrate includes a lower region, a trench region which is formed on the lower region, and a plurality of trenches formed in the trench region.

According to some embodiments, a method of fabricating a semiconductor substrate includes providing a substrate, forming a plurality of trenches in an upper part of the substrate, and forming a semiconductor layer on a surface of the substrate.

According to some embodiments, a method of fabricating a semiconductor device includes providing a semiconductor substrate which includes a substrate and a semiconductor layer formed on the substrate, forming a wiring layer on the semiconductor layer, bonding a supporting substrate onto the wiring layer, and removing the substrate to expose the semiconductor layer, wherein the substrate includes a lower region and a trench region which is formed on the lower region and in which a plurality of trenches are formed.

According to some embodiments, a method of fabricating an image sensor includes providing a semiconductor substrate which includes a substrate and a semiconductor layer formed on the substrate, wherein the substrate includes a lower region and a trench region which is formed on the lower region and in which a plurality of trenches are formed, forming photoelectric converters in the semiconductor layer, forming a wiring layer on the semiconductor layer, bonding a supporting substrate onto the wiring layer, and removing the lower region to expose an end of each trench, removing the trench region to expose the semiconductor layer, and forming color filters and micro-lenses on the exposed semiconductor layer.

While the inventive principles have been particularly shown and described with reference to example embodiments thereof, it will be understood by those of ordinary skill in the art that various changes may be made in form and details without departing from the scope of the invention as defined by the following claims. The example embodiments should be considered in a descriptive sense only and not for purposes of limitation. Some example embodiments include at least one of the inventive features present in the example embodiments described above, while other example embodiments may include combinations of two or more of any of the inventive features present in the example embodiments described above.

The invention claimed is:

1. A method of fabricating a semiconductor device, comprising:
    providing a semiconductor substrate comprising a sub-substrate and a semiconductor layer formed on the sub-substrate, wherein the sub-substrate comprises a lower region and region which is formed on the lower region and in which a plural of trenches are formed;
    forming a wiring layer on the semiconductor layer;
    bonding a supporting, substrate onto the wiring layer; and
    removing the sub-substrate to expose the semiconductor layer.

2. The method of claim 1, wherein the removing of the sub substrate comprises:
    removing the lower region to expose an end of each trench; and
    removing the trench region to expose the semiconductor layer.

3. The method of claim 2, wherein the removing of the trench region comprises performing a wet-etching process.

4. The method of claim 3, wherein the removing of the trench region further comprises performing a chemical mechanical polishing (CMP) process after the performing wet-etching process.

5. The method of claim 1, wherein plurality trenches are filled by a buried film.

6. The method of claim 5, wherein the removing of the sub-substrate comprises:
    removing the lower region to expose an end clench trench;
    removing the buried film which tills the plurality of trenches; and
    removing the trench region to expose the semiconductor layer.

7. The method of claim 1, wherein the plurality of trenches of the semiconductor substrate are formed on a top surface of the sub-substrate.

8. A method of fabricating an image sensor, comprising:
    providing a semiconductor substrate comprising a lib-substrate and a semiconductor layer formed on the sub-substrate, wherein the sub-substrate comprises a lower region and a trench region which is formed on the lower region and in which a plurality of trenches are formed;
    forming photoelectric converters in the semiconductor layer;
    forming a wiring layer on the semiconductor layer;
    bonding a supporting substrate onto the wiring layer; and
    removing the lower region to expose an end of each trench;
    removing the trench region to expose the semiconductor layer; and
forming color filters and micro-lenses on the exposed semiconductor layer.

9. The method of claim 8, wherein the removing of the trench region comprises performing a wet-etching process.

10. The method of claim 9, wherein the removing of the trench region further comprises performing a CMP process after the performing wet-etching process.

11. The method of claim 8, wherein the plurality of trenches are filled by a buried film.

12. The method of claim 11, further comprising removing the buried film, which fills the plurality of trenches, before removing the trench region to expose the semiconductor layer.

13. The method of claim 11, wherein the buried film is an oxide film, a nitride film or an oxy-nitride film.

14. The method of claim 8, wherein the plurality of trenches of the semiconductor substrate are formed on a top surface of the sub-substrate.

* * * * *